United States Patent
Bhargava et al.

(10) Patent No.: US 6,241,819 B1
(45) Date of Patent: Jun. 5, 2001

(54) METHOD OF MANUFACTURING QUANTUM SIZED DOPED SEMICONDUCTOR PARTICLES

(75) Inventors: Rameshwar Bhargava, Ossining, NY (US); Dennis Gallagher, Stamford, CT (US)

(73) Assignee: North American Philips Corp., New York, NY (US)

( * ) Notice: Subject to any disclaimer, the term of this patent is extended or adjusted under 35 U.S.C. 154(b) by 0 days.

(21) Appl. No.: 08/050,693

(22) Filed: Apr. 20, 1993

(51) Int. Cl.[7] ........................................... C30B 7/00
(52) U.S. Cl. .................... 117/68; 117/73; 117/75; 117/956
(58) Field of Search ....................... 156/600, 621, 156/624; 117/68, 73, 75, 956

(56) References Cited

U.S. PATENT DOCUMENTS 4,974,933 * 12/1990 Ainslie et al. .................. 350/96.34
5,093,286 * 3/1992 Nogami et al. .................. 561/12
5,238,607 * 8/1993 Herron et al. .................. 252/518

OTHER PUBLICATIONS

Wang et al "Three Dimensionally Confined Diluted Magnetic Semiconductor Clusters; $Zn_1Mn_xS$", Solid State Communications, vol. 77, No. 1 pp. 33–38 1991.*

"Crystallization of an Inorganic Phase Controlled by a Polymer Matrix" P.A. Bianconi et al, Nature, 349, 315 Jan. 25, 1991.

"Photochemistry of Colloidal Metal Sulfides . . . " H. Weller et al, Ber. Bunsenges. Phys. Chem. 88 649 1984, month unknown.

"Nanometer–Sized Semiconductor Clusters: Materials Synthesis, Quantum Size Effects, and Photophysical Properties" Wang et al, Physical Chemistry, Jan. 24, 1991, No. 2.

* cited by examiner

Primary Examiner—Robert Kunemund
(74) Attorney, Agent, or Firm—Ernestine C. Bartlett

(57) ABSTRACT

Doped semiconductor nanoparticles of a size (<100 Å) which exhibit quantum effects. The nanoparticles are grown and doped within a polymer matrix.

23 Claims, 2 Drawing Sheets

METHOD OF MANUFACTURING QUANTUM SIZED DOPED SEMICONDUCTOR PARTICLES

BACKGROUND AND SUMMARY OF THE INVENTION

This invention relates to semiconductor materials and particularly to quantum sized doped semiconductor particles and methodology for manufacturing these particles.

By making semiconductor particles small enough to show quantum confinement effects and doping them with a luminescent activator element (referred to as "doped nanocrystals"), new optical properties are created which differ from those of chemically identical bulk material and from the quantum confined host material alone. An activator doped and quantum confined host material was made (ZnS:Mn) that demonstrates blue shift in the excitation wavelengths of the activator for the first time. This new material characteristic indicates a fundamental change in optical properties and this is the first time a material exhibiting this characteristic has been made. Other methods to produce this material and other unique properties, such as rapid luminescent decay and reduced excitation voltages for flat panel cathode ray tubes, are also possible.

It has been recognized that when the radius of a semiconductor crystallite is near that of the Bohr radius of the exciton, there is a quantum size effect and its electronic properties change (Y. Wang and N. Herron, "Nanometer-Sized Semiconductor Clusters: Materials Synthesis, Quantum Size Effects and Photophysical Properties", J. Phys. Chem. 95 525, 1991). This had been observed as a blue shift in the optical bandgap for quantum sized ZnS particles in solution (H. Weller, U. Koch, M. Guitierrez and A. Henglein, "Photochemistry of Colloidal Metal Sulfides. Absorption and Fluorescence of Extremely Small ZnS Particles (The World of Neglected Dimensions)", Ber. Bunsenges. Phys. Chem. 88 649, 1984). Most of the II–VI and some III–V and group IV semiconductors have been prepared as quantum sized particles and demonstrate quantum size effects in their physical properties. The size at which the particles demonstrate changes in their bandgap from the quantum size effects vary with the intrinsic electronic structure of the compound but typically appear when below 100 Å in diameter. To exhibit quantum size effects it is also necessary for the particles to remain isolated from one another, if allowed to aggregate the material exhibits bulk properties despite the small size of the individual particles.

Quantum size particles have previously been prepared in several ways: spontaneous nucleation in solution, heterogeneous growth from a substrate material, growth within a micelle, growth in solution atop a carrier particle, nucleation in a sputtering chamber, and laser ablation. Undoped semiconductor particles of CdS which approach quantum size were prepared in a polymer matrix (See P. A. Bianconi et al "crystallization of an Inorganic Phase Controlled by a Polymer Matrix", Nature 349, 315, 24 Jan. 1991). See also, Wang et al "Three-Dimensionally Confined Diluted Magnetic Semiconductor Clusters: $Zn_{1-x}M_xS$" Solid State Communications, Vol. 77, No. 1, pp. 33–38 (1991). The present invention is directed towards the doping of a quantum sized semiconductor host material with an activator element which demonstrates new material properties.

Possible applications for new materials based on the concepts and materials described in this application include:
Luminescent phosphors for use in cathode ray tubes and lights.
Thin films for electroluminescent displays.
Lasing phosphors.
The use of luminescent activators and magnetic particles for magneto-optical recording and displays.
Lower voltage phosphors for flat cathode ray tubes
Markers for medical diagnosis The present application also provides methodology for manufacturing quantum sized doped semiconductor particles. The methodology is particularly advantageous in that it provides a relatively simple approach to the manufacture of doped quantum sized semiconductor particles at room temperature. Furthermore, the particles so produced are dispersed within a polymer matrix and the reaction which forms the doped particles takes place in the polymer matrix. Thereafter, the polymer matrix maintains the doped particles separate from one another so that they maintain their quantum physical effects without agglomeration.

In the methodology, a metal halide compound containing the metal ion component of the host particle is dissolved in a suitable solvent (such as water) with a metal halide of the dopant (activator). Also dissolved in the solvent is polyethylene oxide (PEO) which is thereafter cast onto a flat surface and dried. The polymer matrix is peeled off the flat surface, cut into coupons and immersed in a hydrocarbon solvent that does not react with the polymer matrix. Also dissolved in the hydrocarbon solvent is a compound which contains the other chemical component of the host needed to form the doped semiconductor particles. The reaction to create and grow the doped semiconductor crystals in the polymer matrix takes place over a period of time, from days to weeks, at room temperature. After the particle growth is complete, the polymer matrix is dried and quantum sized semiconductor doped particles are dispersed within the polymer matrix.

The doped nanocrystals produced by the present invention have a luminescent efficiency which is relatively high for films prepared at room temperature. Normally, thin films of bulk ZnS:Mn used in electroluminescent devices yield high efficiency when prepared above temperatures of 350° C. For powder phosphors, this temperature is frequently as high as 1000° C. However, high processing temperatures would change the morphology of quantum sized particles and destroy their properties. The new doped nanocrystals also emit light significantly faster (shorter luminescent decay time) than that observed with corresponding bulk material. This faster luminescent decay time in a nanocrystal provides advantage over bulk material for application where speed is important, i.e. faster phosphors for next generation TV's and displays. It is believed that this characteristic has not been observed before.

BRIEF SUMMARY OF THE DRAWINGS

For a better understanding of the invention, reference is made to the following drawings which are to be taken in conjunction with the detailed specification to follow.

DETAILED DESCRIPTION OF THE PREFERRED EMBODIMENTS

Figure 1:
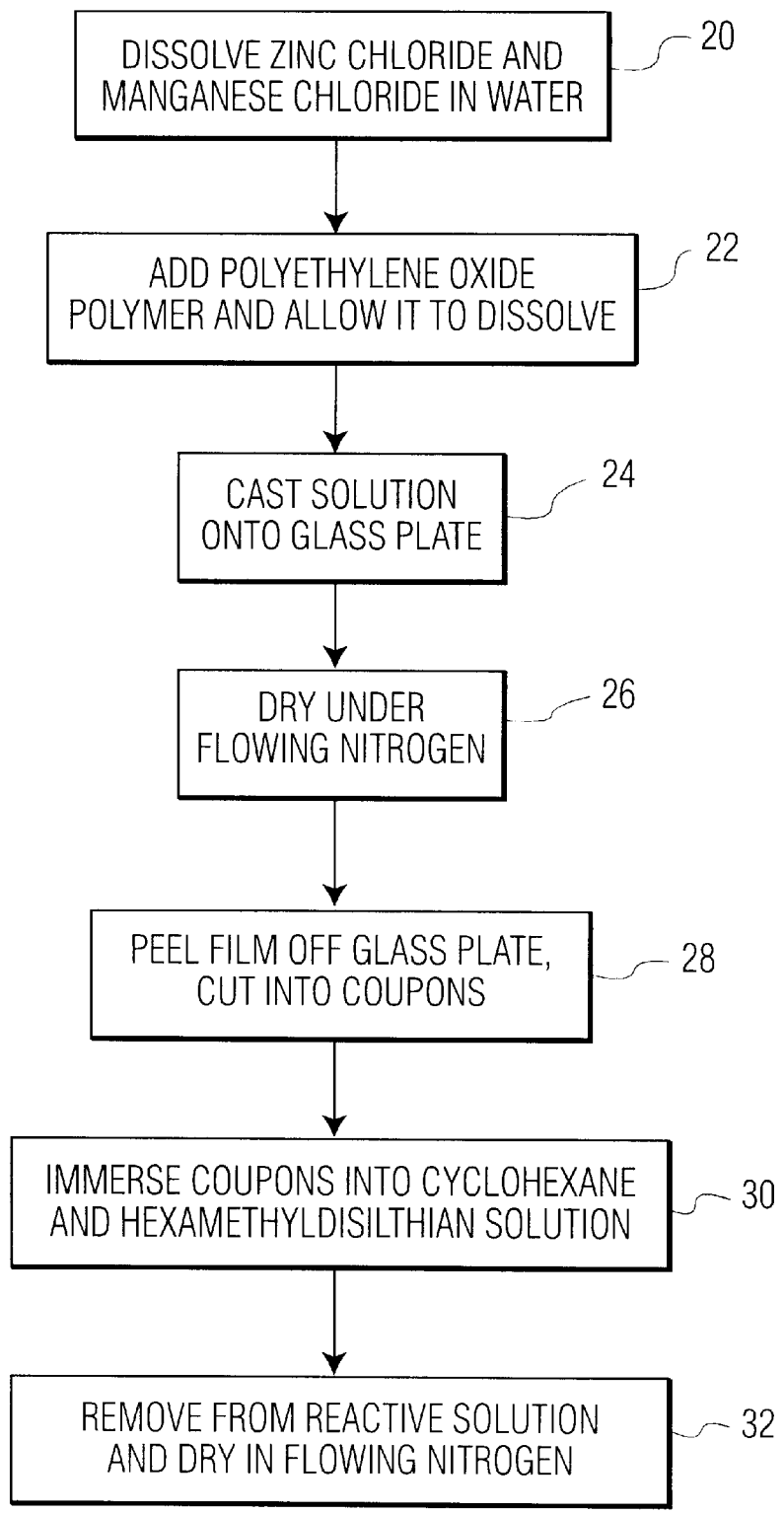
FIG. 1 is a flow chart of the process for making quantum sized doped semiconductor particles.

FIG. 1 illustrates the steps of the process flow chart for the preparation of manganese doped zinc sulphide quantum size particles. The process begins at step 20 wherein zinc chloride and manganese chloride are dissolved in water at room temperature. As is seen at this step a compound containing one of the components of the host and a compound containing the dopant are dissolved at room temperature in a suitable solvent, in this case water. The quantities used herein are 0.09 gram zinc chloride and 0.01 gram manganese chloride dissolved in 30 ml of distilled and de-ionized water, thus an extremely dilute solution of $2.2 \times 10^{-2}$ M (moles/liter) $ZnCl_2$ and $2.7 \times 10^{-3}$M $MnCl_2$. Added to the dissolved solution at step 22 is 1.35 grams of polyethylene oxide ($-CH_2CH_2O-$)$_n$ powder (PEO)[avg. molecular weight 200,000]. The solution was stirred for several hours so as to allow the polyethylene oxide to fully dissolve. Thereafter at step 24 the dissolved solution was cast onto a flat surface in the form of a glass plate. At step 26 the cast solution was dried under flowing nitrogen. The drying step 26 can take place under air, however flowing nitrogen speeds the process and helps prevent crystallization of the PEO. After the drying is complete, at step 28, the film (of approximate thickness of 1 mm) is peeled off of the glass plate and cut into suitable sized coupons and allowed to dry on both sides.

The coupons are thereafter ready to be placed in a reactive solution, again at room temperature, of a solvent at step 30 which will dissolve a sulphur containing compound, but will not dissolve the PEO matrix. A suitable solvent is the hydrocarbon solvent cyclohexane ($C_6H_{12}$). The sulphur bearing compound is hexamethyldisilthian $S(Si(CH_3)_3)_2$ which will dissolve in the cyclohexane and which will diffuse through the PEO matrix and readily cleave off its sulphur. The coupon is left in the solution of step 30 for a period of days or weeks as the reaction proceeds slowly and the doped particles grow within the PEO matrix. The reaction will proceed to grow quantum sized manganese doped zinc sulphide particles. As an alternative to hexamethyldisilthian, hydrogen sulfide gas ($H_2S$) may be bubbled into the cyclohexane. After the reaction is complete at step 32 the coupons are removed and dried in flowing nitrogen. The coupon remains intact but contained within its polymer matrix are the manganese doped zinc sulphide particles of approximately 20–100 Å which have a doping % of Mn of 0.5–1.0%. The polyethylene matrix serves to prevent the particles from clumping together which will ruin the quantum effects.

The incorporation of a luminescing dopant in a nanocrystal yields characteristic emission of the dopant and high luminescent efficiency. For example, Mn in ZnS has a yellow orange emission while Tb doped in ZnS emits green. To obtain yellow orange emission in Mn doped ZnS, the film containing ZnS:Mn particles is excited with a wavelength of 300 nm. However, if the detector is kept at the yellow-orange wavelength and the wavelength of the exciting light is varied, the orange emission due to the $Mn^{2+}$ activator, peaks when energy of the exciting light approaches the bandgap energy of the ZnS particle. The process of monitoring the luminescence using the emission associated with an external impurity is referred as the Photoluminescence excitation (PLE) method. For example the band gap of bulk ZnS is about 339 nm and from PLE measurements the bandgap obtained is 340 nm. Similarly for nanosized particles the bandgap energy has increased to about 310 nm and the peak of the excitation (PLE peak) is 309 nm. Thus with a simple technique of measuring PLE, one can obtain the bandgap of the nanocrystals. This permits the distinguishing of the contribution of the various size of particles to the total luminescent intensity. Besides obtaining the band gap, it can be demonstrated that the Mn ion is an integral part of the ZnS nanocrystal, because it is only excited via the ZnS bandgap. Since in nanocrystals the bandgap is size dependent, the PLE technique is useful to obtain the sizes and their distribution.

Figure 2:
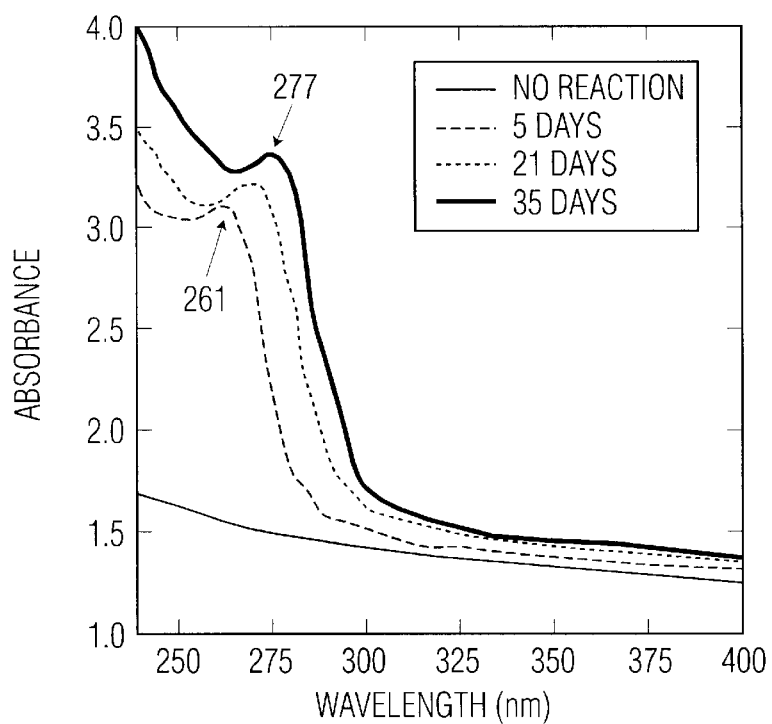
FIG. 2 is a graph of UV absorption vs. wavelength for doped nanoparticles made in accordance with the invention.
Figure 3:
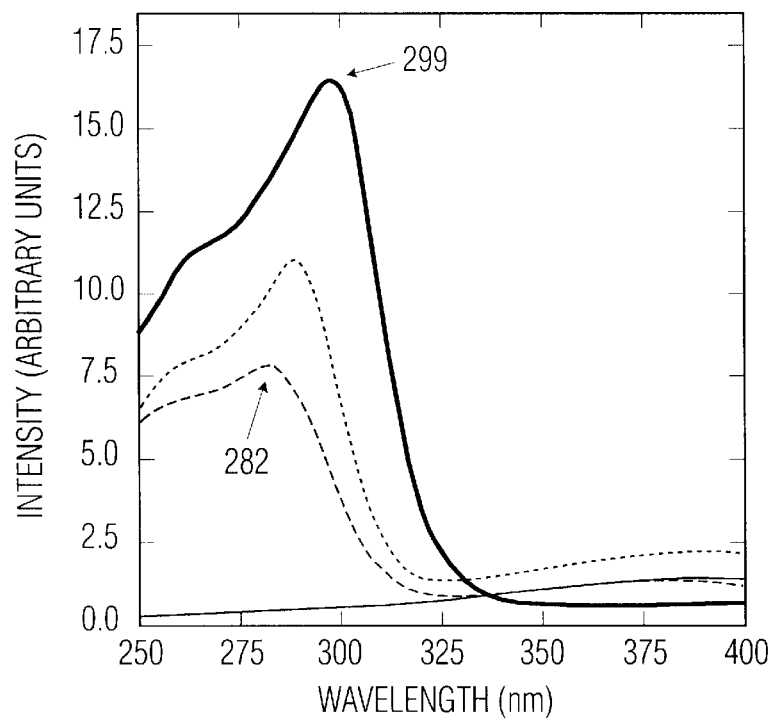
FIG. 3 is a graph of intensity of the photoluminescence of the dopant emission vs. wavelength for the doped nanoparticles.

FIG. 2 is a graph of ultraviolet (UV) absorption plotted against wavelength for doped nanoparticles grown for varying periods of time (i.e. the length of time the coupons are left in the reactive solution). As can be seen the unreacted solution shows no peak across the wavelengths of interest. At 5 days of growth a peak of 261 nm is seen and after 35 days of grown a peak at 277 nm is shown. This indicates that the bandgap narrows and the size of the particles increases as they are left in the reactive solution. Thus, the size of the particles may be readily adjusted by reaction time. Of course if the size becomes too large the quantum effects will diminish or become negligible. FIG. 3 is a graph of photoluminescent excitation vs. wavelength for the $Mn^{2+}$ and again shows a shift towards peaks at longer wavelengths as a function of time in the reactive solution, increases which demonstrates the increasing size of the doped nanocrystals as the reaction progresses.

In this reaction, nitrites such as zinc nitrate, manganese nitrate and certain selected acetates may be utilized in a suitable solvent. Many other solvents could be substituted for the distilled water in the above-described methodology. It is only necessary that the solvent dissolve both the chemical compound containing the first component of the host, the compound containing the dopant and the PEO. Suitable alternative solvents are alcohol and methyl ethyl ketone. The molecular weight and the concentration of the PEO dissolved in the water is not extremely critical. It is only necessary that these parameters be adjusted so that the PEO will dry and that it can be peeled off in coupons so as to be placed in the reactive solution.

In addition to the manganese doping of zinc sulfide the present process is also suitable for doping zinc sulphide with terbium, the starting component is changed to $TbCl_3$. Additionally, other semiconductor host materials may also be prepared and doped with suitable activators. Such host materials may be zinc selinide (ZnSe) zinc telluride (ZnTe) cadmium sulfide (CdS) and cadmium selinide (CdSe) may also be utilized in similar reactions. Finally dopants such as copper, silver, thallium, cerium, chromium, titanium and other rare earth elements may be utilized.

The above described arrangements and processing steps are merely illustrative of the principles of the present invention. Numerous modifications and adaptations thereof will be readily apparent to those skilled in the art without departing from the spirit and scope of the present invention.

What is claimed is:

1. A method of making a doped semiconductor nanocrystal comprising the steps of:
   (a) dissolving a compound containing a first component of the host material, a compound containing the dopant and a matrix forming polymer in a first solvent;
   (b) drying said polymer to form a matrix;
   (c) immersing said polymer matrix containing said dissolved elements into a second solvent, said second solvent being incapable of dissolving said polymer matrix but capable of dissolving a compound containing the second component of said host material;
   (d) dissolving a compound containing the second component of said host material in said second solvent to diffuse through the polymer matrix and to cleave said second component of the host material from said compound and growing said doped nanocrystals within said polymer matrix; and (e) removing said polymer matrix from said second solvent and drying the matrix.

2. The method as claimed in claim 1 wherein at least one of said compound containing said first component of the host material and said compound containing said dopant is a metal halide.

3. The method as claimed in claim 1 wherein said first solvent is water.

4. The method as claimed in claim 1 wherein said matrix forming polymer is polyethylene oxide.

5. The method as claimed in claim 2 wherein said compound containing said first component is zinc chloride.

6. The method as claimed in claim 2 wherein said compound containing said dopant is manganese chloride.

7. The method as claimed in claim 1 wherein said second solvent is an organic solvent.

8. The method as claimed in claim 7 wherein said second solvent is cyclohexane.

9. The method as claimed in claim 1 wherein said first component of said host material is zinc sulphide and said dopant is manganese.

10. The method as claimed in claim 1 wherein said dissolving steps take place at room temperature.

11. A particle of semiconductor material having a diameter of less than 100 Å comprising:

ZnS doped with Tb, having a doping % of less than 1%.

12. A particle of semiconductor material having a diameter of less than 100 Å comprising:

a doping material including at least one of copper, silver, thallium, cerium, chromium, and titanium, having a doping % of less than 1%.

13. A method of making a doped semiconductor nanocrystal comprising a metal sulfide host, said method comprising the steps of (a) dissolving a first metal halide comprising a first metal moiety of said host, a halide comprising a dopant for said host, and a matrix-forming polymer in a first solvent;

(b) drying the resultant solution to form a matrix;

(c) immersing said matrix in a second solvent, said second solvent being incapable of dissolving said matrix but capable of dissolving a compound comprising a second sulfide moiety of said host;

(d) dissolving said compound comprising said second moiety in said second solvent, said second solvent diffusing through said matrix and causing said first metal halide to cleave said second moiety from said compound and react with said second sulfide moiety to form said metal sulfide host, allowing said bound matrix and dopant to flow and thereby form doped semiconductor nanocrystals within said matrix; and (e) removing said matrix from said second solvent and drying said matrix.

14. The method as claimed in claim 13 wherein said first solvent is water.

15. The method as claimed in claim 13 wherein said matrix forming polymer is polyethylene oxide.

16. The method as claimed in claim 13 wherein said halide containing said first metal moiety is zinc chloride.

17. The method as claimed in claim 13 wherein said halide containing said dopant is manganese chloride.

18. The method as claimed in claim 13 wherein said second solvent is an organic solvent.

19. The method as claimed in claim 18 wherein said second solvent is cyclohexane.

20. The method as claimed in claim 13 wherein said metal sulphide host is Zinc sulphide.

21. the method as claimed in claim 13 wherein said dissolving steps take place at room temperature.

22. The method as claimed in claim 13 wherein said metal sulphide host is zinc sulphide and said dopant is manganese.

23. The method as claimed in claim 13 wherein said dopant is selected from the group of manganese, copper, silver, thallium, cerium and titanium.

\* \* \* \* \*